United States Patent
Gao et al.

(10) Patent No.: US 11,999,889 B2
(45) Date of Patent: Jun. 4, 2024

(54) ETCHING SOLUTION AND APPLICATION THEREOF

(71) Applicant: PHICHEM CORPORATION, Shanghai (CN)

(72) Inventors: Xiaoyi Gao, Shanghai (CN); Hangjian Hu, Shanghai (CN)

(73) Assignee: PHICHEM CORPORATION, Shanghai (CN)

( * ) Notice: Subject to any disclaimer, the term of this patent is extended or adjusted under 35 U.S.C. 154(b) by 165 days.

(21) Appl. No.: 17/485,546

(22) Filed: Sep. 27, 2021

(65) Prior Publication Data

US 2022/0098486 A1   Mar. 31, 2022

(30) Foreign Application Priority Data

Sep. 29, 2020   (CN) .......................... 202011053024.5

(51) Int. Cl.
  *C09K 13/06*   (2006.01)
(52) U.S. Cl.
  CPC .................................. *C09K 13/06* (2013.01)
(58) Field of Classification Search
  None
  See application file for complete search history.

(56) References Cited

U.S. PATENT DOCUMENTS

| | | | |
|---|---|---|---|
| 2009/0239954 A1* | 9/2009 | Collins | A61K 45/06 514/714 |
| 2020/0024750 A1 | 1/2020 | Sasaki | |
| 2022/0098487 A1* | 3/2022 | Gao | C09K 13/04 |

FOREIGN PATENT DOCUMENTS

| KR | 20120051488 A | 5/2012 |
|---|---|---|
| KR | 20170138929 A | 12/2017 |

* cited by examiner

*Primary Examiner* — Allan W. Olsen
(74) *Attorney, Agent, or Firm* — Samson G. Yu

(57) ABSTRACT

The present disclosure relates to the technical field of etching. More specifically, the present disclosure relates to an etching solution and an application thereof. A preparation raw material of the etching solution includes at least one oxidant, at least one stabilizer, and deionized water. Through the combined action of hydrogen peroxide and stabilizer, the etching solution of the present disclosure has the good stability, the longer service life, the faster etching rate and the better stability of the etching rate, and the etching solution of the present disclosure has a good etching effect on a titanium-series metal.

13 Claims, 1 Drawing Sheet

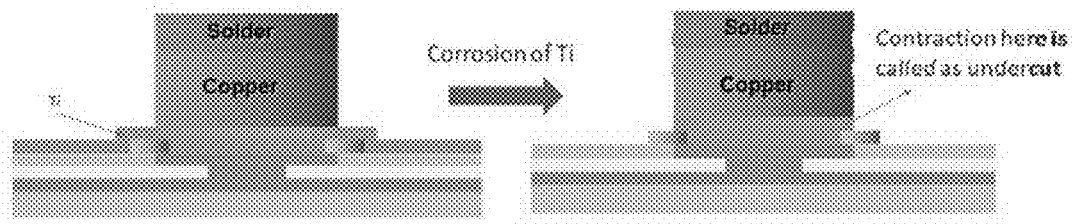

ETCHING SOLUTION AND APPLICATION THEREOF

TECHNICAL FIELD

The present disclosure relates to the technical field of etching, more specifically, the present disclosure relates to an etching solution and an application thereof in etching of a titanium-series metal.

BACKGROUND

Titanium or titanium-tungsten alloy, as a titanium-series metal, is often used as a substrate layer of a tin or tin alloy nickel structure copper pillar, a tin or tin alloy nickel pillar, and a copper wiring in an advanced packaging process. Advanced packaging is a process of making a welding spot or called a bump for a wafer after the production of an integrated circuit chip. The purpose is to construct an interconnection medium for the next interconnection of a single chip. A packaging factory generally re-arranges a circuit or makes the bump for the chip interconnection through a patterned process. The first thing to do is to use a magnetron sputtering machine to sputter a layer of titanium and a layer of copper on the entire surface of the wafer, it is called as a seed layer in the industry. The purpose of sputtering the titanium is to better bond with the wafer, and the purpose of sputtering the copper layer is to make the connection for the next step of electroplating the copper. Before electroplating the copper, it is also necessary to use a photoresist for patterning, so that the electroplated copper may fall on a place in which a hole is arranged. At this point, it may be seen that the purpose of sputtering the metal titanium and copper on the entire surface is to provide a medium for conducting a current during the electroplating, as to guarantee that the entire opening area may be electroplated with the metal. On one wafer, there are generally as few as dozens of chips, and as many as thousands of chips. Because of the existence of the copper layer and the titanium layer, all interconnection positions on the chip are connected to each other, namely they are in a short-circuit state. Therefore, the titanium and copper sputtered in an initial stage need to be removed by an etching mode, as to guarantee that the chip has a specific electrical property while the interconnection bump is manufactured and completed. Therefore, an etching technology occupies an important position in the advanced packaging process.

The etching technology is a technology that uniformly removes the entire surface of a material and selectively partially removes a pattern. Herein, it may be roughly divided into two technologies: wet etching and dry etching. At present, the wet etching is widely used in a bump manufacturing process of the chip due to its advantages of low cost, high reliability, high productivity, and superior etching selection ratio and the like. However, an existing wet etching solution used for titanium etching still has the following disadvantages: (1) the using stability of the etching solution; (2) the too slow etching rate; (3) an aluminum electrode damage problem; (4) incomplete and uneven etching caused by bubbles formed in an etching chemical reaction process; and (5) undercut very easily occurring in the seed titanium layer. The above problems have different manifestations in different systems of the etching solutions. Balancing or solving the above problems at the same time is the biggest problem faced by the etching technology.

Herein, the more common titanium-series metal etching uses a method for treatment by hydrofluoric acid/nitric acid mixed liquid, hydrogen peroxide/hydrofluoric acid mixed liquid, and hydrofluoric acid solution, but because the existing etching liquid contains the hydrofluoric acid, as a result, there is a problem of corrosion of a silicon substrate, a glass substrate, and an aluminum wiring existing in a device. In addition to the above abnormal corrosion, the hydrofluoric-acid-containing etching solution not only puts forward requirements on the manufacturing process, but also has major problems in the safety protection of an operator and the stability of the corrosion rate during the operation. Therefore, the use of hydrogen peroxide system titanium etching to completely avoid the above danger and damage problems from the system is a preferred technical scheme.

To achieve the corrosion of titanium in a hydrogen peroxide system, it must be satisfied that the entire environment of the etching solution is alkaline. However, while a pH>7, hydrogen peroxide becomes extremely unstable along with the increase of the pH. While the pH>8.5, the hydrogen peroxide begins to decompose rapidly. From the perspective of reaction energy, the decomposition of the hydrogen peroxide is an exothermic reaction. At the same time, after the hydrogen peroxide is decomposed, the alkalinity of the etching solution may be further enhanced. The decomposition of the hydrogen peroxide in an alkaline environment is very dangerous. Under the further effect of heat release and alkalinity enhancement, the hydrogen peroxide is self-accelerated to complete bumping or even sputtering. Therefore, stabilizing the etching solution environment in the titanium etching solution of the alkaline hydrogen peroxide is the most basic technical key point. Moreover, a degree of the stability of the hydrogen peroxide in the etching solution also directly determines the service life of the etching solution.

In addition, from the perspective of the efficiency of the chemical reaction, the hydrogen peroxide system is naturally weaker than the hydrofluoric acid for the corrosion of titanium. But it is considered that, in the advanced packaging process, the wafers used are all owned by its customers. While the wafer is damaged, the packaging factory does not have the ability to reproduce it, and may only compensate the customers for wafer loss, and at the same time affect the subsequent commercial cooperation. In this background, it is not only a problem of a process window, but the damage of the hydrofluoric acid to a chip substrate and an aluminum electrode is even more unacceptable. Therefore, increasing the rate of hydrogen peroxide system (fluorine-free) titanium etching solution is another key task.

The uniformity problem is generally a problem of process control, and it is also a basic guarantee for the undercut. The excellent uniformity is beneficial to control the amount of overetching, thereby the undercut is reduced. However, in a poorer environment, a problem of titanium residue may not be solved by increasing the etching time, this may directly affect the electrical performance of the chip, and may seriously cause a short circuit of the chip. So the uniformity is an indicator worth paying attention to.

The existing manufacturing process of the chip bump is relatively mature, but as the size of the element in the integrated circuit becomes smaller and smaller, the size of the bump is required to be further reduced. Since the chemical reaction has no directionality, the wet etching is isotropic. At this time, while the etching solution is used for longitudinal etching, lateral etching occurs at the same time, and then an undercut phenomenon is caused, as shown in FIG. 1, while the titanium or titanium-tungsten alloy etching solution is applied in the manufacturing process, the excess titanium needs to be etched. The right side of FIG. 1 is a schematic diagram after etching, and a position to which the undercut refers is as shown by a right arrow in FIG. 1. During the etching process, the titanium layer metal should be as flush as possible with the structures such as an upper layer tin silver pillar, otherwise the pattern line width may be distorted.

The above problems may affect the reliability of the chip to a large extent. A feasible scheme is to solve the problems in the process by improving the comprehensive energy of the etching solution. But at present, the undercut of the titanium in the etching solution of the hydrogen peroxide system is generally about 0.3 um (the amount of overetching is controlled within 100%), it is far better than the hydrofluoric acid system. Therefore, this performance may not be the focus of attention. Thus, the disclosure focuses on the problems in the aspects such as the stability, the etching rate, and the uniformity of the etching solution.

SUMMARY

In order to solve the above problems, a first aspect of the present disclosure provides an etching solution, and a preparation raw material of the etching solution includes at least one oxidant, at least one stabilizer, and deionized water.

As a preferred technical scheme of the present disclosure, the oxidant is selected from one of hydrogen peroxide, ammonium persulfate, or potassium persulfate.

As a preferred technical scheme of the present disclosure, the stabilizer of the present disclosure contains at least two stabilizers. As a preferred technical scheme of the present disclosure, the stabilizer includes a stabilizer A having a phosphate radical.

As a preferred technical scheme of the present disclosure, the phosphate radical in the stabilizer A accounts for 0.3-8 wt % of the etching solution.

As a preferred technical scheme of the present disclosure, the stabilizer includes a stabilizer B, and the stabilizer B is one or more of an organophosphorus acid and salts thereof.

As a preferred technical scheme of the present disclosure, the organophosphorus acid is selected from at least one of 1-Hydroxyethylidene-1,1-diphonic acid, Ethylenebis(nitrilodimethylene)tetraphosphonic acid, Hexamethylenediamine-N,N,N',N'-tetrakis, Diethylenetriaminepenta(methylene-phosphonic acid), 1-Hydroxyethylidene-1,1-diphonic acid, Amino tris(methylene phosphonic acid), or Ethylene-diaminetetramethylenephosphonic acid.

As a preferred technical scheme of the present disclosure, the stabilizer B accounts for 0.05-5 wt % of the etching solution.

As a preferred technical scheme of the present disclosure, the stabilizer includes a stabilizer C, and the stabilizer C is one or more of an organic poly-carboxylic acid and salts thereof.

As a preferred technical scheme of the present disclosure, the organic poly-carboxylic acid is selected from at least one of iminodiacetic acid, nitrilotriacetic acid, ethylenediaminetetraacetic acid, diethylenetriaminepentaacetic acid, 3-hydroxy-1,3,5-glutaric acid, 2-hydroxysuccinic acid, tartaric acid, or succinic acid.

As a preferred technical scheme of the present disclosure, the stabilizer C accounts for 0.1-10 wt % of the etching solution.

A second aspect of the present disclosure provides an application of the etching solution in etching of a titanium-series metal.

Compared with an existing technology, the present disclosure has the following beneficial effects.

(1) By using the etching solution of the hydrogen peroxide system, working with the stabilizer, the present disclosure may improve the stability of the etching solution, avoid the excessive decomposition of the hydrogen peroxide, and have the longer service life.

(2) Through the content of each component in the etching solution, the present disclosure may elevate the etching rate, maintain the stability of the etching rate, and have a good effect on the etching of the titanium-series metal, such as metallic titanium and titanium-tungsten alloy.

(3) The etching solution provided by the present disclosure has the good etching uniformity and no etching residue.

BRIEF DESCRIPTION OF THE DRAWINGS

FIG. 1 is a schematic diagram of a titanium etching process.

DETAILED DESCRIPTION OF THE EMBODIMENTS

The content of the present disclosure may be more easily understood by referring to the following detailed descriptions of preferred implementation methods of the present disclosure and included embodiments. Unless otherwise defined, all technical and scientific terms used herein have the same meaning as commonly understood by those of ordinary skill in the art to which the present disclosure belongs. In the case of conflicting, the definition in this description is used as a standard.

As used herein, a term "prepared from" is synonymous with "comprising". Terms "comprising", "including", "having", "containing" or any other variations as used herein are intended to cover non-exclusive inclusion. For example, a composition, a process, a method, a product or a device containing listed elements is not necessarily limited to those elements, but may include other elements that are not explicitly listed or elements inherent in such a composition, process, method, product or device.

A conjunction "consisting of" excludes any unspecified elements, processes or components. If used in a claim, this phrase may make the claim closed, so that it does not contain materials other than those materials described, except for conventional impurities related to it. While the phrase "consisting of" appears in a clause of the subject of the claim instead of immediately following the subject matter, it is only limited to the elements described in the clause; and other elements are not excluded from the claim as a whole.

While the amount, concentration, or other values or parameters are expressed in a range, a preferred range, or a range defined by a series of upper limit preferred values and lower limit preferred values, this should be understood as specifically disclosing all ranges formed by any one pair of any range upper limits or preferred values and any range lower limits or preferred values, regardless of whether the ranges are separately disclosed. For example, while a range "1 to 5" is disclosed, the described range should be interpreted as including ranges "1 to 4", "1 to 3", "1 to 2", "1 to 2 and 4 to 5", "1 to 3 and 5" and the like. While a numerical range is described herein, unless otherwise stated, the range is intended to include its end values and all integers and fractions within the range.

The singular form includes a plural discussion object, unless clearly indicated in the context otherwise. "Optional" or "any one" means that an item or an event described subsequently may occur or not occur, and the description includes a situation that the event occurs and a situation that the event does not occur.

Approximate terms in the description and claims are used to modify a quantity, it is indicated that the present disclosure is not limited to the specific quantity, but also includes an acceptable modified part close to the quantity that does not lead to a change of a related basic function. Correspondingly, modifying a numerical value with "approximate", "about" and the like means that the present disclosure is not limited to the precise numerical value. In some examples, the approximate terms may correspond to the accuracy of an instrument used to measure the numerical value. In the description and claims of the present application, the range definition may be combined and/or interchanged, and unless otherwise stated, these ranges include all sub-ranges contained in between.

In addition, indefinite articles "a" and "an" before the element or the component of the present disclosure have no limitation to the quantity requirements (namely the number of occurrences) of the element or the component. Therefore, "a" or "an" should be explained to include one or at least one, and the element or the component in the singular form also include the plural form, unless the number clearly refers to the singular form.

The present disclosure is described below through specific embodiments, but is not limited to the specific embodiments given below.

A first aspect of the present disclosure provides an etching solution, and a preparation raw material of the etching solution includes at least one oxidant, at least one stabilizer, and deionized water.

Oxidant

In one description, the oxidant of the present disclosure is selected from one of hydrogen peroxide, ammonium persulfate, or potassium persulfate; and further, the oxidant of the present disclosure is preferably the hydrogen peroxide. While the etching solution of the present disclosure is used in an etching process, the oxidant of the present disclosure is not only an oxidant for an etching reaction of titanium, but also a complexant that helps dissolve ionic titanium. In terms of content, while the content of the hydrogen peroxide is too low, the etching reaction rate of titanium is greatly reduced. It is found by the inventor of the present disclosure through a lot of experiments that the etching reaction rate of titanium is too low, while the hydrogen peroxide content below 5 wt %, and it does not make much sense for applications. With the increase of the hydrogen peroxide content, the etching reaction rate of the titanium is increased. But a risk of the hydrogen peroxide decomposition is increased, a space for dissolving other stabilizers is greatly reduced, the probability of the risk of the etching solution is increased, and a large amount of the titanium salt may be dissolved in the etching process. At the same time, because the water content is compressed by the hydrogen peroxide, a crystal is easily separated out, as to cause the chip and machine contamination. Therefore, the content of the hydrogen peroxide should be controlled below 30 wt %. In some preferred embodiments, the oxidant of the present disclosure accounts for 8-25 wt % of the etching solution. In some preferred embodiments, the oxidant accounts for 10-25 wt % of the etching solution. In some preferred embodiments, the oxidant accounts for 10-23 wt % of the etching solution. In some preferred embodiments, the oxidant accounts for 10-20 wt % of the etching solution. In some preferred embodiments, the oxidant accounts for 10-18 wt % of the etching solution. In some preferred embodiments, the oxidant accounts for 14-25 wt % of the etching solution. In some preferred embodiments, the oxidant accounts for 13-23 wt % of the etching solution. In some preferred embodiments, the oxidant accounts for 15-25 wt % of the etching solution.

In some embodiments, the stabilizer of the present disclosure includes at least two stabilizers.

In some embodiments, the stabilizer of the present disclosure includes a stabilizer A having a phosphate radical.

Stabilizer A

It is found by the inventor of the present disclosure that while the hydrogen peroxide is used as the oxidant to etch titanium, it is necessary to control a pH of a system to be alkaline. Under an alkaline condition, the hydrogen peroxide is unstable, and along with the increase of the decomposition of the hydrogen peroxide, the alkalinity of the system is further enhanced, so aluminum may be corroded, herein the aluminum is a common chip electrode material, and is very easily damaged in a hydrofluoric acid environment. A hydrogen peroxide environment may generate an aluminum oxide film on the surface of the aluminum, as to protect the aluminum, but because the aluminum is an amphoteric metal, while the pH of the etching solution is greater than or close to 10, the aluminum oxide film on the aluminum surface is very easily damaged, it is caused that the corrosion of the aluminum is increased significantly. So even in the hydrogen peroxide environment, there is also damage to the aluminum. Therefore, damage data to the aluminum in the hydrogen peroxide environment is still important. In order to reduce the excessive corrosion of the aluminum, it is necessary to guarantee that the pH of the etching solution used in the present disclosure is less than 10. In the present disclosure, the pH in the etching solution is controlled stably by using the stabilizer A as buffer, as to avoid the excessive decomposition of the hydrogen peroxide and the corrosion to the aluminum.

In some embodiments, the stabilizer A of the present disclosure is an inorganic phosphate, and examples thereof include sodium phosphate, potassium phosphate, and ammonium phosphate. The phosphate is a buffer with an excellent buffering effect under the alkaline condition, and has a very good effect on stabilizing the pH of the etching solution. The stabilizer A of the present disclosure may be prepared by mixing a phosphoric acid with sodium hydroxide, potassium hydroxide, ammonium, alkali metal and the like, as to achieve a purpose of adjusting the pH by the stabilizer A, and achieve the pH control of the etching solution system. Because the inorganic phosphate in water may generate the buffer solution containing structures such as phosphate ions, hydrogen phosphate ions, dihydrogen phosphate ions, and phosphoric acid, the present disclosure uses the content of the phosphate radical as a measurement unit to determine the buffering capacity; and herein the phosphate radical content may be obtained by an ion chromatography test, and the content of all phosphate radicals in the etching solution including the phosphate ions, the hydrogen phosphate ions, and the dihydrogen phosphate ions are tested.

It is founded by the inventor of the present disclosure that the phosphate radical content less than 0.3 wt %, the buffer ability of the etching solution under the alkaline condition is insufficient. Regardless of its practicality, the content of the stabilizer A is continuously increased, the etching solution may be promoted to be more stable. It should be noted that while the phosphate radical is 8 wt %, the mass fraction of the phosphate may reach up to 17 wt %, and the phosphate radical content exceeding 8 wt % may greatly increase the risk of crystal precipitation, thereby the chip and the machine contamination is caused, and while the phosphate radical content is greater than about 6.5 wt %, the improved stability of the phosphate radical is no longer increased significantly with the increase of the phosphate radical. Therefore, the phosphate radical in the stabilizer A of the present disclosure accounts for 0.3-8 wt % of the etching solution; in some preferred embodiments, the phosphate radical in the stabilizer A accounts for 0.3-6.5 wt % of the etching solution, in some preferred embodiments, the phosphate radical in the stabilizer A accounts for 0.3-5 wt % of the etching solution, in some preferred embodiments, the phosphate radical in the stabilizer A accounts for 0.3-4.5 wt % of the etching solution, in some preferred embodiments, the phosphate radical in the stabilizer A accounts for 0.3-3.6 wt % of the etching solution, in some preferred embodiments, the phosphate radical in the stabilizer A accounts for 0.3-3.5 wt % of the etching solution, in some preferred embodiments, the phosphate radical in the stabilizer A accounts for 1-6 wt % of the etching solution, in some preferred embodiments, the phosphate radical in the stabilizer A accounts for 1-5.5 wt % of the etching solution, in some preferred embodiments, the phosphate radical in the stabilizer A accounts for 1-5 wt % of the etching solution, in some preferred embodiments, the phosphate radical in the stabilizer A accounts for 1.5-5 wt % of the etching solution, in some preferred embodiments, the phosphate radical in the stabilizer A accounts for 1.5-4.5 wt % of the etching solution, in some preferred embodiments, the phosphate radical in the stabilizer A accounts for 2.5-5.5 wt % of the etching solution, in some preferred embodiments, the phosphate radical in the stabilizer A accounts for 2.5-4.5 wt % of the etching solution, in some preferred embodiments, the phosphate radical in the stabilizer A accounts for 3.0-4.5 wt % of the etching solution, in some preferred embodiments, the phosphate radical in the stabilizer A accounts for 3.2-4.5 wt % of the etching solution, in some preferred embodiments, the phosphate radical in the stabilizer A accounts for 3.5-6.5 wt % of the etching solution, in some preferred embodiments, the phosphate radical in the stabilizer A accounts for 3.5-5.5 wt % of the etching solution.

It is found by the inventor of the present disclosure that while the phosphate radical content in the stabilizer A of the present disclosure is controlled to be 0.3-6.5 wt %, the pH of the etching solution of the present disclosure may be controlled to be 8-10. Moreover, it is found by the inventor that while the pH of the etching solution system is lower than 8, the etching rate of the etching solution is too slow, it does not have much application value. If the pH of the etching solution system is higher than 10, the etching solution very easily produces the problem of bumping or sputtering, and the stability of the etching solution is extremely difficult to control, serious safety hazards are brought and the corrosion of an aluminum electrode is aggravated, so the safety risk in the etching process is increased.

In some embodiments, the stabilizer of the present disclosure includes a stabilizer B.

Stabilizer B

It is found by the inventor of the present disclosure that by adding the stabilizer A to control the pH of the etching solution, although it is beneficial to the corrosion of the hydrogen peroxide to the titanium-series metal, but at the same time, the alkaline condition also causes the decomposition of the hydrogen peroxide to be increased, so that the service life of the etching solution is reduced, and the stability of the etching rate is reduced. It is found by the inventor that by adding the organic phosphonic acid or the organic phosphonate as the stabilizer B, it may be combined with metal ions in the environment in which the hydrogen peroxide is located, as to block the specific metal ions from catalyzing the decomposition of the hydrogen peroxide, so a purpose of stabilizing the hydrogen peroxide in a liquid medicine is achieved. In an embodiment, the stabilizer B of the present disclosure is one or more of an organophosphorus acid and salts thereof.

Preferably, the organophosphorus acid of the present disclosure is selected from at least one of 1-Hydroxyethylidene-1,1-diphonic acid, Ethylenebis(nitrilodimethylene)tetraphosphonic acid, Hexamethylenediamine-N,N,N',N'-tetrakis, Diethylenetriaminepenta(methylene-phosphonic acid), 1-Hydroxyethylidene-1,1-diphonic acid, Amino tris(methylene phosphonic acid), or Ethylenediaminetetramethylenephosphonic acid. The organic phosphonate in the present disclosure is a sodium salt, a potassium salt, an amine salt and the like of the organic phosphonic acid, it is not specifically limited.

It is found by the inventor of the present disclosure that while the stabilizer B below 5 wt % is added, it may play a significant stabilizing effect. The requirements of a purity degree of the etching solution in semiconductor manufacturing are considered, and metals may be dissolved into the etching solution in a process of etching the titanium. Therefore, the content of the stabilizer B at about 1 wt % meets the needs of the etching solution system already. The content of the stabilizer B exceeding 5 wt % may occupy the water content, the etching solution may have the risk of crystal precipitation, and it is found by the inventor that in general application requirements, the content of the stabilizer B below 0.05 wt % may not guarantee the stability of the hydrogen peroxide in the later stage of titanium-series metal etching. Therefore, preferably, the stabilizer B of the present disclosure accounts for 0.05-5 wt % of the etching solution, in some preferred embodiments, the stabilizer B accounts for 0.05-4.5 wt % of the etching solution, in some preferred embodiments, the stabilizer B accounts for 0.05-4 wt % of the etching solution, in some preferred embodiments, the stabilizer B accounts for 0.05-3.5 wt % of the etching solution, in some preferred embodiments, the stabilizer B accounts for 0.05-3 wt % of the etching solution, in some preferred embodiments, the stabilizer B accounts for 0.05-2.5 wt % of the etching solution, in some preferred embodiments, the stabilizer B accounts for 0.05-2 wt % of the etching solution, in some preferred embodiments, the stabilizer B accounts for 0.05-1.5 wt % of the etching solution, in some preferred embodiments, the stabilizer B accounts for 0.05-1 wt % of the etching solution, in some preferred embodiments, the stabilizer B accounts for 0.1-3 wt % of the etching solution, in some preferred embodiments, the stabilizer B accounts for 0.1-2.5 wt % of the etching solution, in some preferred embodiments, the stabilizer B accounts for 0.1-2 wt % of the etching solution, in some preferred embodiments, the stabilizer B accounts for 0.1-1.5 wt % of the etching solution, in some preferred embodiments, the stabilizer B accounts for 0.1 to 1 wt % of the etching solution, in some preferred embodiments, the stabilizer B accounts for 0.2-3 wt % of the etching solution, in some preferred embodiments, the stabilizer B accounts for 0.2-2 wt % of the etching solution, in some preferred embodiments, the stabilizer B accounts for 0.2-1.5 wt % of the etching solution, and in some preferred embodiments, the stabilizer B accounts for 0.2-1 wt % of the etching solution.

In some embodiments, the stabilizer of the present disclosure includes a stabilizer C.

Stabilizer C

It is found by the inventor of the present disclosure that by adding the stabilizer A and the stabilizer B, the catalytic decomposition of the hydrogen peroxide by the metal ions may be avoided to a certain extent, and the stability and etching rate of the etching solution are improved. However, the hydrogen peroxide itself also tends to decompose rapidly in the alkaline condition, and along with the gradual combination of the stabilizer B and the metal ions, there may be a risk of precipitation. It is found by the inventor that by adding a organic poly-carboxylic acid to the etching solution as the stabilizer C, it may have an ionization inhibiting effect on the hydrogen peroxide in the etching solution, and the activity of the hydrogen peroxide is inhibited to a certain extent, especially while the hydrogen peroxide has the high decomposition activity, the stabilizer C has a significant inhibitory effect on it, and a polyhydric hydroxy acid radical in the stabilizer C has a good solubilizing effect on substances produced by the combination of the stabilizer B and the metal ions, and a problem of metal residue caused by the adsorption of the stabilizer B on the metal surface may be effectively solved. In some embodiments, the stabilizer C of the present disclosure is one or more of the organic poly-carboxylic acid and salts thereof; and further, the polybasic organic hydroxy acid of the present disclosure is selected from at least one of iminodiacetic acid, nitrilotriacetic acid, ethylenediaminetetraacetic acid, diethylenetriaminepentaacetic acid, 3-hydroxy-1,3,5-glutaric acid, 2-hydroxysuccinic acid, tartaric acid, and succinic acid. The polybasic organic hydroxy acid salt of the present disclosure may be a sodium salt, a potassium salt, an amine salt and the like of the polybasic organic hydroxy acid, it is not specifically limited.

It is found by the inventor of the present disclosure that while the content of the stabilizer C of the present disclosure needs to be controlled between 0.2-10 wt %, it may effectively control the hydrogen peroxide ionization inhibition and the stabilizer A to adjust the pH so as to promote the balance of etching the metal in the etching solution. In the etching process, while the hydrogen peroxide in the etching solution performs the etching, because of the ionization inhibition of the stabilizer C, the excessive ionization of the hydrogen peroxide is avoided, and at the same time, while the ionization of the hydrogen peroxide is less, because the pH is controlled by the stabilizer A, the oxidation of the hydrogen peroxide to the metal may be further promoted, the etching rate of the etching solution is increased while the etching stability is improved, as to achieve the dynamic balance. In addition, it is found by the inventor that while the content of the stabilizer C in the etching solution is higher than 10 wt %, it may occupy the content of the water, so that a crystal is separated out, and while the content of the stabilizer C is less than 0.1 wt %, the cleaning effect on the stabilizer B is not apparent. Therefore, the stabilizer C of the present disclosure accounts for 0.1-10 wt % of the etching solution, in some preferred embodiments, the stabilizer C accounts for 0.1-8 wt % of the etching solution, in some preferred embodiments, the stabilizer C accounts for 0.1-6 wt % of the etching solution, in some preferred embodiments, the stabilizer C accounts for 0.1-5 wt % of the etching solution, in some preferred embodiments, the stabilizer C accounts for 0.5-5 wt % of the etching solution, in some preferred embodiments, the stabilizer C accounts for 1-5 wt % of the etching solution, in some preferred embodiments, the stabilizer C accounts for 2.5-10 wt % of the etching solution, in some preferred embodiments, the stabilizer C accounts for 2.5-8 wt % of the etching solution, in some preferred embodiments, the stabilizer C accounts for 2.5-5 wt % of the etching solution, in some preferred embodiments, the stabilizer C accounts for 0.1-2.5 wt % of the etching solution, and in some preferred embodiments, the stabilizer C accounts for 0.5-2.5 wt % of the etching solution.

In addition, it is found by the inventor that in order to improve the solubilization effect of the stabilizer C on the stabilizer B, the ratio of the stabilizer C and the stabilizer B needs to be controlled. While the ratio of the two is lower than 3, it may not help dissolve for a long time, and while the ratio of the two is higher than 6, the content of the stabilizer C used is more, and it is not beneficial to the improvement of the etching rate and the stability and uniformity of etching. In some preferred embodiments, the weight ratio of the stabilizer C and the stabilizer B in the etching solution of the present disclosure is (3-6):1, in some preferred embodiments, the weight ratio of the stabilizer C and the stabilizer B in the etching solution of the present disclosure is (3.5-5.5):1, in some preferred embodiments, the weight ratio of the stabilizer C and the stabilizer B in the etching solution of the present disclosure is (3.5-5):1, in some preferred embodiments, the weight ratio of the stabilizer C and the stabilizer B in the etching solution of the present disclosure is (4-5): 1, in some preferred embodiments, the weight ratio of the stabilizer C and the stabilizer B in the etching solution of the present disclosure is (4.5-5.5):1, in some preferred embodiments, the weight ratio of the stabilizer C and the stabilizer B in the etching solution of the present disclosure is (4.5-5):1, and in some preferred embodiments, the weight ratio of the stabilizer C and the stabilizer B in the etching solution of the present disclosure is 5:1.

A preparation method for the etching solution is not specifically limited in the present disclosure, and it may be prepared by methods such as mixing.

A second aspect of the present disclosure provides an application of the above etching solution in etching of a titanium-series metal. The titanium-series metal of the present disclosure may be a metallic titanium or titanium-containing alloy material, and the titanium-series metal material, such as a titanium-tungsten alloy, is used for advanced packaging.

Performance Evaluation

Performance parameter test standard:
1. $H_2O_2$ relative reduction, the code is K, the unit is %; K=(initial hydrogen peroxide content−hydrogen peroxide content at detection time point)/initial hydrogen peroxide content, K24, K48, K72, and K96 are used to represent the relative reduction of the hydrogen peroxide in the etching solution at 24 h, 48 h, 72 h, and 96 h respectively; and the low K value is excellent, and the general application requirement is less than 10%.
2. Etching rate, the unit is Å/s; a wafer with 3000 Å of a titanium layer thickness is used, a certain number of points are collected on the wafer (the present disclosure uses an 8-inch wafer, and a method for uniformly collecting 24 points), a titanium etching thickness X is measured, and the total time of the etching process is recorded as t. Etching rate=Xavg/t, herein Xavg is an average value of the etching thickness.
3. Etching stability, the code is P, and the unit is %; P=(detection point rate−initial rate)/2; P24, P48, P72, and P96 are used to represent the relative stability of the titanium etching rate at 24 h, 48 h, 72 h, and 96 h respectively; and the low P value is excellent, and the general application requirement is less than 10%.

4. 72 h etching rate, the unit is Å/s; by the method in 3, the rate is measured while the etching solution is prepared at 72 h; and the high value is excellent, and the general application requirement is greater than 5 Å/s.

It should be noted here that under the same conditions, the etching rate and the etching stability are a pair of contradictions. It is unreasonable to observe the initial etching rate unilaterally as a representation of the etching ability. In the same way, under a condition of too low rate (less than 5 Å/s), it is also not representational to evaluate the stability of the etching solution in one dimension.

Therefore, the high etching rate has representation significance under the premise that the etching rate is stable within an application time. Generally, the application life of the etching solution is in the range of 24-48 h. It is required that the selected evaluation point needs to be longer than 48 h, and the etching solution may not be decomposed and fail completely due to too long time. Therefore, 72 h is selected here as the representation time point, and used as a key indicator for measuring the comprehensive capability of the etching solution of the present disclosure.

5. Uniformity, the unit is %; and a certain number of points are collected on the wafer. In the present disclosure, the 8-inch wafer is used, and the method for uniformly collecting 24 points is used, as to measure the etching thickness X.

The uniformity=$(X_{max}-X_{min})/(2X_{avg})$, herein $X_{max}$, $X_{min}$, and $X_{avg}$ represent the maximum, minimum and average values of the etching thickness respectively. Herein, the small uniformity is an excellent value, and the general application requirement is less than 5%.

In order to guarantee the parallel implementation of the embodiment and the contrast example, an experimental process uses the wafer with 3000 Å of the seed titanium layer thickness to perform a soaking experiment of the etching solution. In addition, a recommended using condition of the etching solution of the present disclosure is 20-45° C. The application scenarios of the etching solution are considered, and the using condition below 20° C. is not considered generally. But it is used under the condition higher than 45° C., the decomposition risk of the etching solution may be increased to a certain extent. In order to compare the characteristics of the present disclosure in parallel, the temperature is controlled at 30° C. in the embodiment and the contrast example.

In addition, in the determination of the two values of K and S, a fixed-point test is required according to a rule of time. In order to more effectively simulate the using condition of the etching solution, in the experimental process, the titanium is dissolved at a rate of 0.01 g/h per liter of the etching solution; a hydrogen peroxide test is performed once every 24 hours; and a pH value test is performed once every 24 hours. In addition, the present disclosure no longer lists the contrast examples of the fluorine-containing etching solutions, the disadvantages as described above are difficult to accept in the application field already.

Herein the formulas and dosages of the etching solutions provided in the embodiments and the contrast examples are shown in Table 1.

TABLE 1

Specific components and content of etching solution

| | Stabilizer A | | | | | | |
|---|---|---|---|---|---|---|---|
| | $H_2O_2$/wt % | Phosphate radical/wt % | pH | Etching rate/(Å/s) | Stabilizer B/wt % | Stabilizer C/wt % | Deionized water |
| Contrast example 1 | 13 | 4.5 | 9.52 | 10.3 | / | / | Margin |
| Contrast example 2 | 10 | 3.2 | 8.49 | 6.8 | 1-Hydroxyethylidene-1,1-diphonic acid 0.2 | / | Margin |
| Contrast example 3 | 13 | 2.5 | 8.5 | 7 | Dipropylene glycol butyl ether 15 | / | Margin |
| Contrast example 4 | 17 | 1.6 | 7.01 | 0.7 | / | Ethylenediamine tetraacetic acid 5 | Margin |
| Contrast example 5 | 25 | 0.3 | 8.5 | 10.8 | Amino tris(methylene phosphonic acid) 1 | Tartaric acid 5 | Margin |
| Embodiment 1 | 13 | 4.5 | 8.51 | 7 | Hexamethylenediamine-N,N,N',N'-tetrakis 1 | Tartaric acid 5 | Margin |
| Embodiment 2 | 10 | 3.2 | 9.52 | 16.9 | 1-Hydroxyethylidene-1,1-diphonic acid 0.2 | 3-hydroxy-1,3,5-glutaric acid 1 | Margin |
| Embodiment 3 | 13 | 2.5 | 8.5 | 10.5 | Diethylenetriaminepenta (methylene-phosphonic acid) 0.1 | Ethylenediamine tetraacetic acid 0.5 | Margin |
| Embodiment 4 | 17 | 1.6 | 9.03 | 7.1 | Amino tris(methylene phosphonic acid) 1 | Ethylenediamine tetraacetic acid 5 | Margin |
| Embodiment 5 | 14 | 3.5 | 8.81 | 11.8 | Diethylenetriaminepenta (methylene-phosphonic acid) 1 | 2-hydroxysuccinic acid 5 | Margin |
| Embodiment 6 | 18 | 3.51 | 8.83 | 9.2 | Diethylenetriaminepenta (methylene-phosphonic acid) 1 | 2-hydroxysuccinic acid 5 | Margin |
| Embodiment 7 | 23 | 3.5 | 8.82 | 10.6 | Diethylenetriaminepenta (methylene-phosphonic acid) 1 | 2-hydroxysuccinic acid 5 | Margin |

TABLE 1-continued

Specific components and content of etching solution

| | | Stabilizer A | | | | | |
|---|---|---|---|---|---|---|---|
| | $H_2O_2$/wt % | Phosphate radical/wt % | pH | Etching rate/(Å/s) | Stabilizer B/wt % | Stabilizer C/wt % | Deionized water |
| Embodiment 8 | 14 | 3.48 | 9.02 | 11.3 | Ethylenebis(nitrilodimethylene) tetraphosphonic acid 0.5 | 3-hydroxy-1,3,5-glutaric acid 2.5 | Margin |
| Embodiment 9 | 14 | 3.5 | 9.18 | 11.2 | Ethylenebis(nitrilodimethylene) tetraphosphonic acid 0.5 | 3-hydroxy-1,3,5-glutaric acid 2.5 | Margin |
| Embodiment 10 | 14 | 3.5 | 9.45 | 13.1 | Ethylenebis(nitrilodimethylene) tetraphosphonic acid 0.5 | 3-hydroxy-1,3,5-glutaric acid 2.5 | Margin |

The performance test results of Embodiments 1-10 and Contrast Examples 1-5 of the present disclosure are shown in Table 2.

TABLE 2

Performance test result

| 30° C. | 72 h etching rate/(Å/s) | Uniformity/% | 24 h stability K24/% | P24/% | 48 h stability K48/% | P48/% | 72 h stability K72/% | P72/% | 96 h stability K96/% | P96/% |
|---|---|---|---|---|---|---|---|---|---|---|
| Contrast example 1 | 1.32 | 4.64 | 38.92 | 25.7 | 64.2 | 53.1 | 86.3 | 87.2 | 95.3 | 100 |
| Contrast example 2 | 6.35 | 23.9 | 3.27 | 1.68 | 6.6 | 3.37 | 10.14 | 6.6 | 14.66 | 11.29 |
| Contrast example 3 | 5.03 | 6.12 | 2.8 | 1.9 | 6.67 | 5.05 | 15.26 | 18.93 | 26.61 | 29.03 |
| Contrast example 4 | 0.70 | 16.3 | 0.54 | 0.02 | 1.23 | 0.08 | 2.07 | 0.14 | 3.11 | 0.36 |
| Contrast example 5 | 4.77 | 5.32 | 15.17 | 23.16 | 39.36 | 35.84 | 52.31 | 52.76 | 77.88 | 72.53 |
| Embodiment 1 | 6.93 | 5.76 | 1.11 | 0.16 | 1.69 | 0.31 | 2.88 | 1.01 | 4.57 | 2.91 |
| Embodiment 2 | 16.00 | 3.75 | 2.53 | 1.26 | 5.12 | 2.53 | 7.92 | 5.34 | 11.7 | 9.61 |
| Embodiment 3 | 9.89 | 4.66 | 2.74 | 1.41 | 5.54 | 2.83 | 8.55 | 5.79 | 12.54 | 10.21 |
| Embodiment 4 | 7.02 | 4.36 | 1.01 | 0.11 | 1.93 | 0.28 | 3.07 | 1.14 | 4.88 | 3.26 |
| Embodiment 5 | 11.47 | 5.13 | 1.54 | 0.32 | 3.12 | 0.89 | 4.86 | 2.76 | 7.14 | 5.48 |
| Embodiment 6 | 9.01 | 5.42 | 1.21 | 0.12 | 2.33 | 0.54 | 3.67 | 2.11 | 5.62 | 4.61 |
| Embodiment 7 | 10.36 | 5.23 | 1.2 | 0.14 | 2.44 | 0.53 | 3.84 | 2.23 | 5.78 | 4.76 |
| Embodiment 8 | 11.05 | 5.44 | 1.25 | 0.18 | 2.27 | 0.61 | 3.85 | 2.17 | 5.96 | 4.92 |
| Embodiment 9 | 10.77 | 4.32 | 2.03 | 0.76 | 4.16 | 1.41 | 6.42 | 3.84 | 9.76 | 7.68 |
| Embodiment 10 | 12.56 | 3.66 | 2.09 | 0.84 | 4.17 | 1.76 | 6.44 | 4.1 | 9.47 | 7.6 |

The significance of the performance indicators of the etching solution of the present disclosure is synthesized, herein, the 72 h etching rate and the uniformity are key technical indicators of the present disclosure, and it is necessary to guarantee that the former is greater than 5 Å/s, and the latter is less than 5%.

It may be seen from the comparison between Contrast Example 1 and the embodiments of the present disclosure that the stabilizer selected in the etching solution of the present disclosure apparently plays a key role in a stabilizing reaction of the etching solution of the present disclosure; it may be seen from the comparison between Contrast Example 2 and Embodiment 2 of the present disclosure that in the absence of the stabilizer C, the corrosion uniformity of the metal is significantly affected; and it may be seen from the comparison between Contrast Example 3 and Embodiment 3 of the present disclosure that the combination of the stabilizers in the present disclosure may make the etching solution have the excellent stability in the etching process.

It may be seen from the comparison between Contrast Example 4 and the embodiments of the present disclosure that in the absence of the stabilizer B, the etching rate of the etching solution is too slow, and at the same time it also has an adverse effect on the uniformity of etching; and it may be seen from the comparison between the Contrast Example 5 and the embodiments of the present disclosure that the increase of the pH of the etching solution in Contrast Example 5 caused by the decomposition of the hydrogen peroxide may not be effectively inhibited, and the etching solution of the present disclosure has the excellent stability through the synthetic action of a plurality of the stabilizers.

It may be seen from Embodiment 5, Embodiment 6 and Embodiment 7 of the present disclosure that although the etching rate may be increased by increasing the concentration of the hydrogen peroxide or increasing the pH of the etching solution, the increase of the pH of the etching solution is more effective in increasing the rate of the etching solution relative to the increase of the concentration of the hydrogen peroxide, but the increase of the pH may reduce the stability of the etching solution to a certain extent; and it may be seen from Embodiment 1 and Embodiment 2 of the present disclosure that in the case that the contents of the stabilizer B and the stabilizer C are increased synchronously, a situation of the uniformity may be deteriorated to a certain extent, but the stability of the etching solution may be improved to a certain extent.

Based on the above embodiments, it may be seen that the etching solution of the present disclosure may effectively balance the stability, the etching rate, the uniformity and other factors of the etching process, achieve an effective balance, and has the apparent advantages in comprehensive ability.

The previous embodiments are only illustrative, and are used to explain some features of the method of the present disclosure. The appended claims are intended to require a widest conceivable scope, and the embodiments disclosed in the present application are only descriptions of the selected embodiments based on combinations of all possible embodiments. Therefore, the applicant's intention is that the appended claims are not limited by the selection of examples for illustrating the characteristics of the present disclosure. Some numerical ranges used in the claims also include sub-ranges within them, and changes in these ranges should also be interpreted as being covered by the appended claims in the possible case.

What is claimed is:

1. An etching solution, wherein a preparation raw material of the etching solution comprises at least one oxidant, deionized water, and the following stabilizer:
   stabilizer A: an inorganic phosphate, the phosphate radical in the stabilizer A accounts for 3.5-6.5 wt % of the etching solution;
   stabilizer B: an organic phosphonic acid and salts thereof;
   stabilizer C: an organic poly-carboxylic acid and salts thereof;
   the oxidant is selected from one of hydrogen peroxide, ammonium persulfate, or potassium persulfate;
   the weight ratio of the stabilizer C and the stabilizer B in the etching solution is (3-6):1.

2. The etching solution according to claim 1, wherein the organic phosphonic acid is selected from at least one of Hydroxyethylidene diphosphate, Ethylenebis (nitrilodimethylene) tetraphosphonic acid, Hexamethylenediamine-N, N,N',N'-tetrakis (methylphosphonic Acid), Diethylene triamine penta (methylene-phosphonic acid), Hydroxyethylidene diphosphate, Amino tris (methylene phosphonic acid), or Ethylenediamine tetramethylene phosphonate.

3. The etching solution according to claim 2, wherein the organic phosphonic acid is selected from at least one of 1-Hydroxyethylidene-1,1-diphonic acid, Ethylenebis (nitrilodimethylene) tetraphosphonic acid, Hexamethylenediamine-N,N,N',N'-tetrakis, Diethylene triamine penta (methylene-phosphonic acid), 1-Hydroxyethylidene-1,1-diphonic acid, Amino tris (methylene phosphonic acid), or Ethylenediamine tetramethylene phosphonic acid.

4. The etching solution according to claim 1, wherein the stabilizer B accounts for 0.05-5 wt % of the etching solution.

5. The etching solution according to claim 4, wherein the stabilizer B accounts for 0.1-1 wt % of the etching solution.

6. The etching solution according to claim 1, wherein the organic poly-carboxylic acid is selected from at least one of iminodiacetic acid, nitrilotriacetic acid, ethylenediamine tetraacetic acid, diethylenetriamine pentaacetic acid, 3-hydroxy-1,3,5-glutaric acid, 2-hydroxysuccinic acid, tartaric acid, or succinic acid.

7. The etching solution according to claim 6, wherein the organic poly-carboxylic acid is selected from at least one of ethylenediamine tetraacetic acid, 3-hydroxy-1,3,5-glutaric acid, 2-hydroxysuccinic acid, or tartaric acid.

8. The etching solution according to claim 1, wherein the stabilizer C accounts for 0.1-10 wt % of the etching solution.

9. The etching solution according to claim 8, wherein the stabilizer C accounts for 0.5-5 wt % of the etching solution.

10. The etching solution according to claim 1, wherein the oxidant accounts for 8-25 wt % of the etching solution.

11. The etching solution according to claim 1, wherein the oxidant is selected from one of hydrogen peroxide.

12. An application of the etching solution according to claim 1 in etching of a titanium-series metal.

13. The application according to claim 12, wherein the titanium-series metal is a metallic titanium or a titanium-tungsten alloy.

* * * * *